(12) United States Patent
Oikawa

(10) Patent No.: US 6,587,000 B2
(45) Date of Patent: Jul. 1, 2003

(54) CURRENT MIRROR CIRCUIT AND ANALOG-DIGITAL CONVERTER

(75) Inventor: Naoto Oikawa, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/104,761

(22) Filed: Mar. 22, 2002

(65) Prior Publication Data
US 2002/0135424 A1 Sep. 26, 2002

(30) Foreign Application Priority Data
Mar. 26, 2001 (JP) ........................... 2001-088891

(51) Int. Cl.[7] .................................................. H03F 3/04
(52) U.S. Cl. .............................. 330/288; 323/315
(58) Field of Search ....................... 330/288; 323/315, 323/316

(56) References Cited

U.S. PATENT DOCUMENTS 4,629,973 A * 12/1986 Voorman ............... 323/316
5,694,033 A * 12/1997 Wei et al. .............. 323/315
6,181,195 B1 * 1/2001 McIntyre ............... 327/538

FOREIGN PATENT DOCUMENTS

JP   A 2000-114891   4/2000
JP   A 2000-341126   12/2000

OTHER PUBLICATIONS

Gray et al., "Analog Integrated Circuit Design Technique, Low Part" (1990) pp. 286–288.

* cited by examiner

Primary Examiner—Henry Choe
(74) Attorney, Agent, or Firm—Hayes Soloway P.C.

(57) ABSTRACT

Current mirror circuit includes first constant current source, first and second MOS transistors, and first and second operational amplifiers. First constant current source outputs constant current to a first node based on a first reference voltage. First MOS transistor has source grounded, gate connected to the second MOS transistor and drain connected to the first node. Second MOS transistor has source grounded, gate connected to the first MOS transistor and drain connected to a second node. First operational amplifier has first input terminal connected to the first node, second input terminal connected to a third node connected to a second reference voltage and an output terminal connected to the gates of the first and second MOS transistors. Second operational amplifier has first input terminal connected to the third node, second input terminal connected to the second node and output terminal connected through feedback circuit to the second node.

11 Claims, 6 Drawing Sheets

US 6,587,000 B2

CURRENT MIRROR CIRCUIT AND ANALOG-DIGITAL CONVERTER

BACKGROUND OF THE INVENTION

1. Field of the Invention

The present invention relates to a current mirror circuit and an analog-digital converter. More particularly, the present invention relates to a current mirror circuit and an analog-digital converter, in which a current mirror having a high accuracy can be obtained even at a low power supply voltage.

2. Description of the Related Art

A current mirror circuit is a circuit for sending to a second transistor connected to a first transistor the same current as the current flowing through the first transistor or the proportional current, as if it is a mirror.

Typically, a drain current IDS of a MOS transistor in a saturation region is given by:

$$I_{DS} = (1/2) \times \mu \times C_{OX} \times (W/L) \times (V_{GS} - V_t)2 \times (1 + \lambda \times V_{DS}) \quad (1)$$

In the equation (1), $\mu$ is a mobility of a carrier, $C_{OX}$ is a thickness of gate oxide film, L is a length of a channel, W is a width of the channel, $V_t$ is a threshold voltage, $V_{GS}$ is a voltage between a gate and a source, $V_{DS}$ is a voltage between a drain and the source, and $\lambda$ is a channel length modulation coefficient.

In the usual current mirror circuit, as indicated by the equation (1), even if the gate-source voltages $V_{GS}$ are equal to each other, a drain-to-source voltage $V_{DS}$ of an NMOS transistor on an input side is different from that of an NMOS transistor on an output side. For this reason, the channel length modulation effect resulting from the channel length modulation coefficient $\lambda$ causes a large error to occur between an input current (standard current $I_{in}$) and an output current $I_{out}$. In order to reduce this error resulting from the channel length modulation effect, the counter-plan is typically carried out by designing the current mirror circuit as a cascode connection and the like.

The cascode current mirror circuit is disclosed in, for example, "Analog Integrated Circuit Design Technique, Low Part (1990) p286–288" written by Gray et al. An output resistance of the current mirror circuit can be increased by designing the current mirror circuit as the cascode connection. As a result, it is possible to reduce the error caused by the channel length modulation effect.

As a conventional example of a related current mirror circuit, Japanese Laid Open Patent Application (JP-A 2000-114891) discloses "Current Source Circuit".

FIG. 1 is a circuit diagram showing the configuration of that current mirror circuit.

A current mirror circuit 101 is provided with an operational amplifier 111, a constant current source 130, and N-channel MOS transistors Q101, Q102 and Q103. Hereafter, the N-channel MOS transistor is referred to as an NMOS transistor.

A high potential side voltage source (not shown) is connected to one of both terminals of a constant current source 130, and a power supply voltage $V_{DD}$ is inputted/supplied. A drain of the NMOS transistor Q101 and a non-inverting input terminal of the operational amplifier 111 are connected to the other terminal of the constant current source 130. The constant current source 130 outputs the standard current $I_{in}$ from the other terminal, based on the power supply voltage $V_{DD}$. The drain of the NMOS transistor Q101 is connected to a gate of the NMOS transistor Q101.

A drain of the NMOS transistor Q102 is connected to an inverting input terminal of the operational amplifier 111 and a source of the NMOS transistor Q103. A gate of the NMOS transistor Q102 is connected to the gate of the NMOS transistor Q101. The sources of the NMOS transistor Q101 and the NMOS transistor Q102 are grounded.

The gate of the NMOS transistor Q103 is connected to an output terminal of the operational amplifier 111. The drain of the NMOS transistor Q103 is connected to an output terminal Z. The output terminal Z is connected to a load circuit (not shown) An output current $I_{out}$ (the voltage between the terminal Z and the ground: the output voltage $V_{out}$) corresponding to the standard current $I_{in}$ is supplied through the output terminal Z to the load circuit (not shown).

Due to the operational amplifier 111, the drain voltage of the NMOS transistor Q102 is set to be substantially equal to the drain voltage of the NMOS transistor Q101. If the drain voltage of the NMOS transistor Q103 is changed by the variation in the load circuit and the like, the source voltage of the NMOS transistor Q103, namely, the drain voltage of the NMOS transistor Q102 is changed correspondingly to the change. The output voltage of the operational amplifier 111 is also changed on the basis of the change in the drain voltage of the NMOS transistor Q102.

For example, if the drain voltage of the NMOS transistor Q102 is increased and it becomes higher than the drain voltage of the NMOS transistor Q101, a voltage difference between the drain voltages of the NMOS transistors Q101, Q102 is generated correspondingly to the increase in the drain voltage of the NMOS transistor Q102. The output voltage of the operational amplifier 111 is dropped correspondingly to the voltage difference. Since the threshold voltage of the NMOS transistor Q103 is constant, the drop in the gate voltage causes the drop in the source voltage, and the drain voltage of the NMOS transistor Q102 is kept substantially constant. On the other hand, if the drain voltage of the NMOS transistor Q102 is dropped, and it becomes lower than the drain voltage of the NMOS transistor Q101, the output voltage of the operational amplifier 111 is increased correspondingly to the drop in the drain voltage of the NMOS transistor Q102. The source voltage of the NMOS transistor Q103 is increased correspondingly to the increase. Accordingly, this increase suppresses the drop tendency of the drain voltage of the NMOS transistor Q102.

As mentioned above, the variation in the drain voltage of the NMOS transistor Q102 caused by the variation in the load circuit (not shown) connected to the drain of the NMOS transistor Q103 and the like is suppressed by the operational amplifier 111. Accordingly, the drain voltage of the NMOS transistor Q102 is kept at the substantially constant level, namely, at the level equal to the drain voltage of the NMOS transistor Q101. If the NMOS transistors Q101, Q102 are under the same condition, for example, if they have the same size and the same carrier mobility, the same current as the NMOS transistor Q101 flows through the NMOS transistor Q102. That is, the output current $I_{out}$ substantially equal to the standard current $I_{in}$ flows through the drain of the NMOS transistor Q103. The output voltage $V_{out}$ (the voltage between the terminal Z and the ground) corresponding to the output current $I_{out}$ is supplied to the load circuit (not shown).

The current mirror circuit 101 shown in FIG. 1 can attain the current mirror circuit having the high accuracy since the operational amplifier 111 forcedly makes the drain-to-source voltages of the NMOS transistors Q101, Q102 equal to each other.

According to the above-mentioned technique disclosed in Japanese Laid Open Patent Application (JP-A 2000-

114891), it is necessary to operate all the transistors (the NMOS transistors Q101, Q102 and Q103) in the saturation region, in order to normally operate the current mirror circuit 101. That is, it is necessary to operate the NMOS transistors Q101, Q102 and Q103 under the following condition:

$$V_{DS} > V_{GS} - V_t \tag{2}$$

The output side in the current mirror circuit 101 is configured as the longitudinal pile (cascode connection) of the two MOS transistors by the NMOS transistors Q102, Q103. For this reason, for example, when the GND (ground) is used as a standard and the sizes of the transistors (W/L, L: Channel Length, W: Channel Width) are equal to each other, if the substrate effect (back gate effect) is ignored, they are not normally operated unless the value of the output voltage $V_{out}$ (the voltage between the terminal Z and the ground) is equal to or greater than two times the value ($V_{GS} - V_t$). That is, the current mirror circuit 101 has the defect that a high accuracy can not be obtained at a low power supply voltage (if the power supply voltage $V_{DD}$ is low). This is because the output side of the current mirror circuit 101 is configured as the longitudinal pile (cascode connection) of the two transistors by the NMOS transistors Q102, Q103.

As the related technique, Japanese Laid Open Patent Application (JP-A 2000-341126) discloses "D/A Converter And Pressure Sensor Circuit Using The Same". This D/A converter is composed of a current mirror circuit, and it includes a constant current circuit and a current-to-voltage converter. In the constant current circuit, an R-2R ladder circuit for determining an output current is connected to a transistor on an output side, and it outputs a current corresponding to a digital value inputted to the R-2R ladder circuit. The current-to-voltage converter outputs a voltage value proportional to an output current of the constant current circuit. Then, this is characterized in that the output voltage of the current-to-voltage converter is outputted.

SUMMARY OF THE INVENTION

Therefore, an object of the present invention is to provide a current mirror circuit and an analog-digital converter, in which a current mirror having a high accuracy can be obtained even at a low power supply voltage.

Another object of the present invention is to provide a current mirror circuit and an analog-digital converter, in which a current mirror having a high accuracy can be obtained without any channel length modulation effect.

In order to achieve an aspect of the present invention, the present invention provides a current mirror circuit including: a first constant current source which outputs a constant current to a first node based on a first reference voltage; a first MOS transistor which has a source grounded, a gate connected to a second MOS transistor and a drain connected to the first node; the second MOS transistor which has a source grounded, a gate connected to the first MOS transistor and a drain connected to a second node; a first operational amplifier which has a first input terminal connected to the first node, a second input terminal connected to a third node which is connected to a second reference voltage and an output terminal connected to the gates of the first and second MOS transistors; and a second operational amplifier which has a first input terminal connected to the third node, a second input terminal connected to the second node and an output terminal connected through a feedback circuit to the second node.

In the current mirror circuit, the first constant current source includes: the first reference voltage; a third MOS transistor which has a source grounded, a gate connected to an output terminal of a third operational amplifier and a drain connected to a current mirror circuit with cascode connection; the third operational amplifier which has a first input terminal connected to the first reference voltage, a second input terminal connected to the gate of the third MOS transistor and an output terminal connected to the gate of the third MOS transistor; and the current mirror circuit with cascode connection which is connected to the drain of the third MOS transistor, a power supply voltage and the first node.

The current mirror circuit further includes: a second resistor and a fourth MOS transistor which are connected in series between a power supply voltage and the drain of the second MOS transistor; and a fifth MOS transistor which is connected in series between the second node and the drain of the second MOS transistor, wherein the second node is connected to a signal voltage through a first resistor.

In order to achieve another aspect of the present invention, the present invention provides an analog-digital converter including: a first constant current source which outputs a constant current to a first node based on a first reference voltage; a first MOS transistor which has a source grounded, a gate connected to a second MOS transistor and a drain connected to the first node; the second MOS transistor which has a source grounded, a gate connected to the first MOS transistor and a drain connected to a second node; a second resistor and a fourth MOS transistor which are connected in series between a power supply voltage and the drain of the second MOS transistor; a fifth MOS transistor which is connected in series between the second node and the drain of the second MOS transistor, wherein the second node is connected to a signal voltage through a first resistor; a first operational amplifier which has a first input terminal connected to the first node, a second input terminal connected to a third node which is connected to a second reference voltage and an output terminal connected to the gates of the first and second MOS transistors; a second operational amplifier which has a first input terminal connected to the third node, a second input terminal connected to the second node and an output terminal connected through a first capacitance to the second node, functioning as an integrator; and a comparator comparing an output of the second operational amplifier with a predetermined voltage, and outputting the comparison result output.

In the analog-digital converter, the first constant current source includes: the first reference voltage, a third MOS transistor which has a source grounded, a gate connected to an output terminal of a third operational amplifier and a drain connected to a current mirror circuit with cascode connection; the third operational amplifier which has a first input terminal connected to the first reference voltage, a second input terminal connected to the gate of the third MOS transistor and an output terminal connected to the gate of the third MOS transistor; and the current mirror circuit with cascode connection which is connected to the drain of the third MOS transistor, a power supply voltage and the first node.

The analog-digital converter further includes a switching controller controlling a switching operations of the fourth and fifth MOS transistors based on the comparison result output.

The analog-digital converter further includes a sixth and a seventh MOS transistors which are connected in series; and a third reference voltage which is connected to a gate of the sixth MOS transistor, wherein a drain of the sixth MOS transistor is connected to the third node, the first input terminal of the first operational amplifier is connected to a node between the sixth and the seventh MOS transistors, instead of the third node, and a gate of the seventh MOS transistor is connected to the gates of the first and the second MOS transistors.

In the analog-digital converter according to claim 4, wherein the first operational amplifier includes: an eighth and a ninth MOS transistors whose sources are connected to each other; a second constant current source which is connected to the sources of the eighth and ninth MOS transistors; and a tenth and an eleventh MOS transistors whose sources are grounded and their gates are connected to each other, wherein a drain of the tenth MOS transistor is connected to a drain of the eighth MOS transistor and the gate of the tenth MOS transistor, a drain of the eleventh MOS transistor is connected to the gates of the first and the second MOS transistors and the drain of the ninth MOS transistor, the gates of the eighth and the ninth MOS transistors correspond to the first and the second input terminal of the first operational amplifier, the gate of the eighth MOS transistor is connected to the first node, the gate of the ninth MOS transistor is connected to the third node, and the drain of the eleventh MOS transistor corresponds to the output terminal of the first operational amplifier.

The analog-digital converter further includes a compensation circuit which is connected between the gate and the drain of the first MOS transistor.

In the analog-digital converter, the compensation circuit includes a second capacitor and a third resistor which are connected in series, wherein the third resistor is connected to the drain of the first MOS transistor, and the second capacitor is connected to the gate of the first MOS transistor.

In the analog-digital converter, the predetermined voltage is equal to the second reference voltage.

DESCRIPTION OF THE PREFERRED EMBODIMENTS

An embodiment of a current mirror circuit and an analog-digital converter according to the present invention will be described below with reference to the attached drawings.

Figure 2:
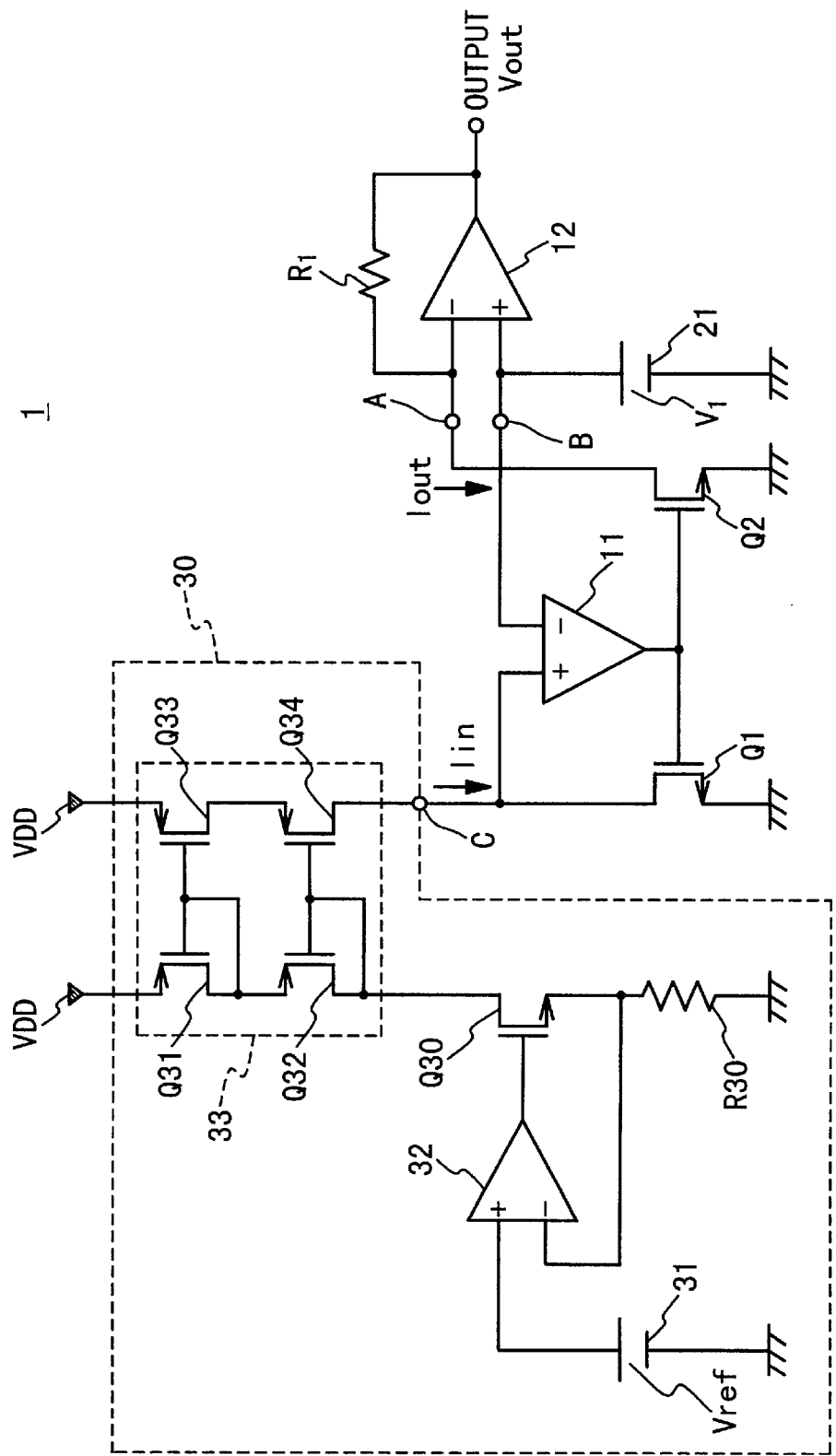
FIG. 2 is a circuit diagram showing a configuration of a current mirror circuit of the present invention.

FIG. 2 is a circuit diagram showing the configuration of a current mirror circuit of the present invention.

A current mirror circuit 1 is provided with a constant current source 30, an operational amplifier 11, N-channel MOS transistors Q1, Q2, an operational amplifier 12, a reference voltage source 21 and a resistor R1. Hereafter, the N-channel MOS transistor is referred to as an NMOS transistor.

A high potential side voltage source (not shown) is connected to one of both terminals of the constant current source 30, and a power supply voltage $V_{DD}$ is inputted/supplied. A drain of the NMOS transistor Q1 and a non-inverting input terminal of the operational amplifier 11 are connected to the other terminal C of the constant current source 30. The constant current source 30 supplies a standard current $I_{in}$ to the NMOS transistor Q1 and the operational amplifier 11.

An output terminal of the operational amplifier 11 is connected to gates of the NMOS transistors Q, Q2. A drain of the NMOS transistor Q2 is connected to a terminal A. An inverting input terminal of the operational amplifier 12 and one of both terminals of the resistor R1 are connected to the terminal A.

A terminal B and a non-inverting input terminal of the operational amplifier 12 are connected to a positive terminal of both terminals of the reference voltage source 21. An inverting input terminal of the operational amplifier 11 is connected to the terminal B. The reference voltage source 21 supplies a reference voltage $V_1$ to the operational amplifiers 11, 12. Sources of the NMOS transistors Q1, Q2 and a negative terminal of the reference voltage source 21 are connected to a low potential side power supply (not shown) and usually grounded.

An output terminal of the operational amplifier 12 is connected to the other terminal of the resistor R1 and a load circuit (not shown). An output voltage $V_{out}$ is supplied to the load circuit (not shown).

Also, the constant current source 30 is composed of a reference voltage source 31, an operational amplifier 32, a resistor R30, an NMOS transistor Q30 and a cascode current mirror circuit 33. The cascode current mirror circuit 33 is composed of P-channel MOS transistors Q31, Q32, Q33 and Q34. Hereafter, the P-channel MOS transistor is referred to as a PMOS transistor.

A positive terminal of both terminals of the reference voltage source 31 is connected to a non-inverting input terminal of the operational amplifier 32. The reference voltage source 31 supplies a reference voltage $V_{ref}$ to the operational amplifier 32. An inverting input terminal of the operational amplifier 32 is connected to a source of the NMOS transistor Q30 and one terminal of the resistor R30. A negative terminal of the reference voltage source 31 and the other terminal of the resistor R30 are connected to the low potential side power supply (not shown) and usually grounded. An output terminal of the operational amplifier 32 is connected to a gate of the NMOS transistor Q30. A drain of the NMOS transistor Q30 is connected to a drain of the PMOS transistor Q32. The drain of the PMOS transistor Q32 corresponds to an input terminal of the cascode current mirror circuit 33.

The drain of the PMOS transistor Q32 is connected to a gate of the PMOS transistor Q32. The gate of the PMOS transistor Q32 is connected to a gate of the PMOS transistor Q34. A source of the PMOS transistor Q32 is connected to a drain of the PMOS transistor Q31.

The drain of the PMOS transistor Q31 is connected to a gate of the PMOS transistor Q31. The gate of the PMOS transistor Q31 is connected to a gate of the PMOS transistor Q33. The drain of the PMOS transistor Q33 is connected to a source of the PMOS transistor Q34.

A high potential side voltage source (not shown) is connected to the sources of the PMOS transistors Q31, Q33, and the power supply voltage $V_{DD}$ is inputted/supplied. The sources of the PMOS transistors Q31, Q33 correspond to one terminal of the constant current source 30. The drain of the PMOS transistor Q34 is connected to the drain of the NMOS transistor Q1 and the non-inverting input terminal of the operational amplifier 11. The PMOS transistor Q34 supplies the standard current in to the NMOS transistor Q1 and the operational amplifier 11. The drain of the PMOS transistor Q34 corresponds to the output terminal of the cascode current mirror circuit 33. Also, the output terminal of the cascode current mirror circuit 33 corresponds to the other terminal of the constant current source 30.

Figure 1:
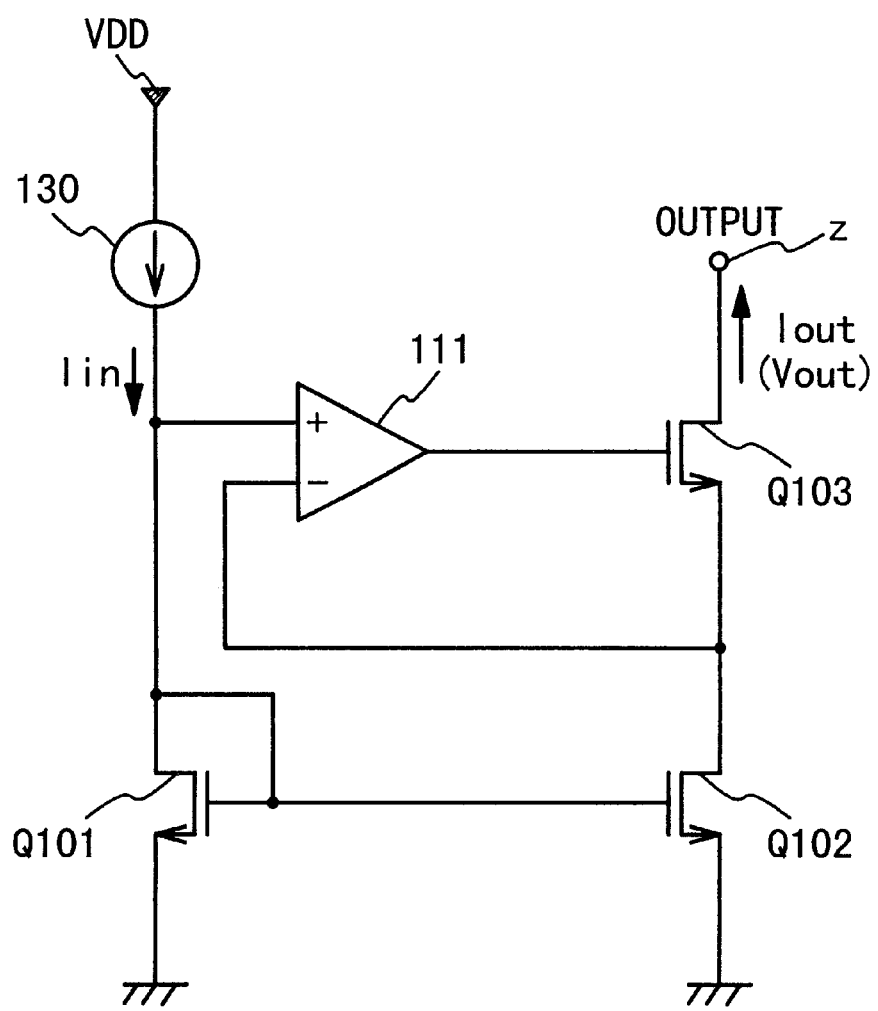
FIG. 1 is a circuit diagram showing a configuration of a conventional current mirror circuit.

The operation of the current mirror circuit 1 will be described below with reference to FIG. 1.

As shown in FIG. 2, the reference voltage $V_{ref}$ is supplied from the reference voltage source 31 to the non-inverting input terminal of the operational amplifier 32 in the constant current source 30. This reference voltage $V_{ref}$ is, for example, the reference voltage generated by a band gap reference circuit, and it is the stable voltage having no dependence on a temperature and the power supply voltage $V_{DD}$. If a DC gain of the operational amplifier 32 is sufficiently large, the output of the operational amplifier 32 is fed back to the inverting input terminal of the operational amplifier 32 from the source of the NMOS transistor Q30. So, by using the fact that the inverting input terminal and the non-inverting input terminal of the operational amplifier 32 are virtually grounded, the operational amplifier 32 keeps the voltage applied to the resistor R30, namely, the source voltage of the NMOS transistor Q30, at the level equal to the reference voltage $V_{ref}$. If a resistance value of the resistor R30 is assumed to be $R_{30}$, a current flowing through the resistor R30 is represented by $V_{ref}/R_{30}$. It is accurately established by the reference voltage $V_{ref}$ from the reference voltage source 31 and the resistance value $R_{30}$ of the resistor R30. Thus, a drain current of the NMOS transistor Q30 does not depend on the power supply voltage $V_{DD}$ and the temperature change, and it becomes the stable standard current $I_{in}$ (=$V_{ref}/R_{30}$)

The standard current $I_{in}$ outputted from the NMOS transistor Q30 is inputted to the cascode current mirror circuit 33 composed of the PMOS transistors Q31, Q32, Q33 and Q34. In the cascode current mirror circuit 33, an output resistance of the cascode current mirror circuit 33 becomes large, which cancels the channel length modulation effect to thereby obtain the stable standard current $I_{in}$. The cascode current mirror circuit 33 sends the stable standard current $I_{in}$ without any channel length modulation effect, as the output current of the constant current source 30, to the non-inverting input terminal and the NMOS transistor Q1.

The standard current $I_{in}$ supplied from the constant current source 30 flows through the NMOS transistor Q1. Also, the reference voltage $V_1$ is supplied from the reference voltage source 21 to the non-inverting input terminal of the operational amplifier 11 and the inverting input terminal of the operational amplifier 12.

The operational amplifier 12 uses the fact that since the output of the operational amplifier 12 is fed back through the resistor R1 to the inverting input terminal of the operational amplifier 12, the DC gain of the operational amplifier 12 is very large and it is virtually grounded, and then carries out the operation so that the drain voltage of the NMOS transistor Q2 is equal to the reference voltage $V_1$ resulting from the reference voltage source 21. That is, the voltage between the terminal A and the ground becomes equal to the voltage between the terminal B and the ground. The operational amplifier 11 uses the fact that the DC gain of the operational amplifier 11 is very large and it is virtually grounded, and then carries out the operation so that the drain voltage of the NMOS transistor Q1 is equal to the reference voltage $V_1$ resulting from the reference voltage source 21. That is, the voltage between the terminal B and the ground becomes equal to the voltage between the terminal C and the ground. As a result, the drain voltage of the NMOS transistor Q2 (the voltage between the terminal A and the ground) is equal to the drain voltage of the NMOS transistor Q1 (the voltage between the terminal C and the ground).

According to the current mirror circuit 1, even the NMOS transistors Q1, Q2, if using the cascode current mirror circuit, can attain the current mirror having the extremely small dependence on the voltage $V_{DS}$ between the drain and the source. However, in this case, it is necessary that the MOS transistors are longitudinally piled in four stages. In order to reserve the accuracy of the typical current mirror circuit, it is necessary that all transistors in the current mirror circuit are operated in the saturation region. However, it is difficult for the cascode current mirror circuit configured as the longitudinal pile of the four stages to attain, in a case of a drop in a power supply voltage associated with a hyper-fined LSI in recent years. It is extremely difficult to attain, for example, in a case of a low voltage such as a single power supply whose power supply voltage $V_{DD}$ is 2.5 [V]±0.2 [V] and the like.

The condition for the sake of the normal operation in the current mirror circuit 1 can be relaxed to the voltage at which the NMOS transistor Q2 is operated at the saturation region, namely, the value equal to or greater than $(V_{GS}-V_t)$. Thus, the current mirror circuit 1 is normally operated at the voltage equal to half the conventional current mirror circuit 101. Then, the current mirror having the high accuracy can be obtained even at the low power supply voltage such as the single power supply whose power supply voltage $V_{DD}$ is 2.5 [V]±0.2 [V].

Also, in the current mirror circuit 1, the operational amplifier 12 carries out the operation so that the drain voltage of the NMOS transistor Q2 (the voltage between the terminal A and the ground) is equal to the reference voltage $V_1$ resulting from the reference voltage source 21 (the voltage between the terminal B and the ground). Then, the operational amplifier 11 carries out the operation so that the drain voltage of the NMOS transistor Q1 (the voltage between the terminal C and the ground) is equal to the reference voltage V, resulting from the reference voltage source 21 (the voltage between the terminal B and the ground). As a result, the drain voltage of the NMOS transistor Q2 (the voltage between the terminal A and the ground) is equal to the drain voltage of the NMOS transistor Q1 (the voltage between the terminal C and the ground). The same standard current $I_{in}$ as the NMOS transistor Q1 flows through the drain of the NMOS transistor Q2. For this reason, it is possible to attain the current mirror circuit having the extremely high accuracy without any channel length modulation effect of the equation (1).

As mentioned above, according to the current mirror circuit 1 of the present invention, it is possible to obtain the current mirror having the high accuracy even at the low power supply voltage.

Also, according to the current mirror circuit 1 of the present invention, it is possible to obtain the current mirror having the high accuracy without any channel length modulation effect.

A first example in which the above-mentioned current mirror circuit 1 is applied to an analog-digital converter will be described below with reference to FIG. 3.

Figure 3:
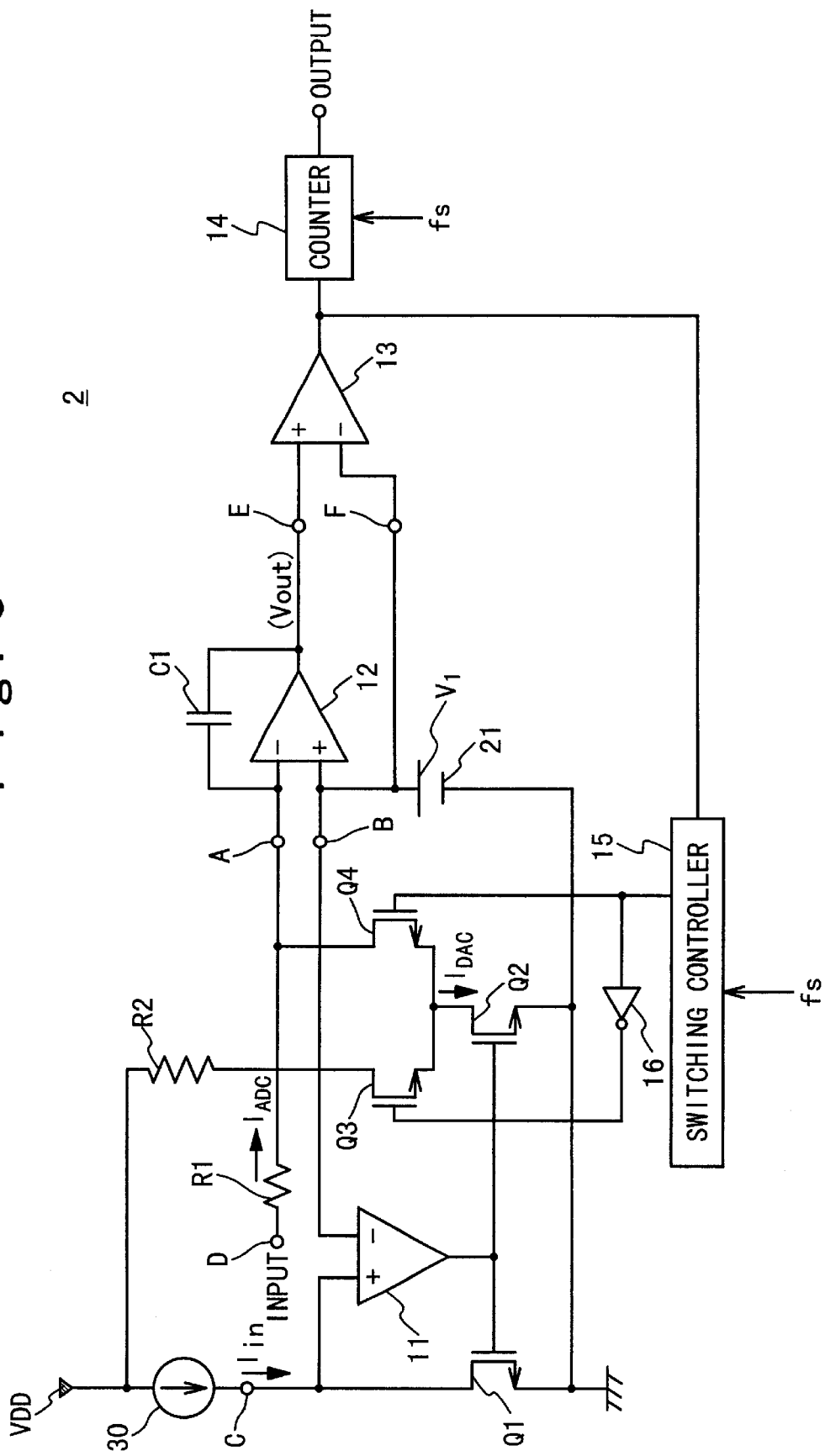
FIG. 3 is a circuit diagram showing a first example in which the current mirror circuit of the present invention is applied to an analog-digital converter.

FIG. 3 is an analog-digital converter 2 to which the current mirror circuit 1 is applied. The analog-digital converter 2 is provided with the constant current source 30, the operational amplifier 11, the operational amplifier 12, a comparator 13, a counter 14, a switching controller 15, an inverter 16, the reference voltage source 21, a capacitor C1, the resistors R1, R2 and the NMOS transistors Q1, Q2, Q3 and Q4. This analog-digital converter 2 is the circuit in the current mirror circuit 1 is applied to a current switch portion (N-channel MOS transistors Q3, Q4) in a charge balancing method. Hereafter, the N-channel MOS transistor is referred to as the NMOS transistor. Also, in the analog-digital converter 2, the same symbols are given to the members similar to those of the current mirror circuit 1. Moreover, the circuit configuration of the constant current source 30 in the analog-digital converter 2 is similar to that of the constant current source 30 in the current mirror circuit 1.

The high potential side voltage source is connected to one of both terminals of the constant current source 30 and one of both terminals of the resistor R2, and the power supply voltage $V_{DD}$ is inputted/supplied. The drain of the NMOS transistor Q1 and the non-inverting input terminal of the a operational amplifier 11 are connected to the other terminal C of the constant current source 30. The constant current source 30 supplies the standard current $I_{in}$.

The output terminal of the operational amplifier 11 is connected to the gates of the NMOS transistors Q, Q2. The drain of the NMOS transistor Q2 is connected to the sources of the NMOS transistors Q3, Q4. The drain of the NMOS transistor Q3 is connected to the other terminal of the resistor R2. A terminal D is connected to one of both terminals of the resistor R1, and a signal voltage from a signal voltage source (not shown) is inputted/supplied. The drain of the NMOS transistor Q4 is connected to the other terminal of the resistor R1 and the terminal A. The inverting input terminal of the operational amplifier 12 and one electrode of both terminals of the capacitor C1 are connected to the terminal A.

The terminal B, the non-inverting input terminal of the operational amplifier 12 and a terminal F are connected to the positive terminal of both terminals of the reference voltage source 21. The inverting input terminal of the operational amplifier 11 is connected to the terminal B. The inverting input terminal of the comparator 13 is connected to the terminal F. The reference voltage source 21 supplies the reference voltage $V_1$ to the operational amplifier 11 and the comparator 13. The sources of the NMOS transistors Q1, Q2 and the negative terminal of the reference voltage source 21 are connected to the low potential side power supply (not shown) and usually grounded.

The other electrode of the capacitor C1 and the terminal E are connected to the output terminal of the operational amplifier 12. The non-inverting input terminal of the comparator 13 is connected to the terminal E. The output voltage $V_{out}$ is supplied from the output terminal of the operational amplifier 12 to the non-inverting input terminal of the comparator 13. Here, the operational amplifier 12 functions as the integrator. The output terminal of the comparator 13 is connected to the input terminal of the switching controller 15 and the input terminal of the counter 14. Also, a sampling clock frequency is inputted from an external portion to the counter 14 and the switching controller 15. Here, the sampling clock frequency is assumed to be fs. An output terminal of the switching controller 15 is connected to the input terminal of the inverter 16 and the gate of the NMOS transistor Q4. An output terminal of the inverter 16 is connected to the gate of the NMOS transistor Q3.

The operation of the analog-digital converter 2 will be described below with reference to FIG. 2.

As shown in FIG. 3, the standard current $I_{in}$ supplied from the constant current source 30 flows through the NMOS transistor Q1. The reference voltage $V_1$ is supplied from the reference voltage source 21 to the inverting input terminal of the operational amplifier 11, the non-inverting input terminal of the operational amplifier 12 and the inverting input terminal of the comparator 13. A voltage from an external portion is supplied to one of both terminals of the resistor R1.

The NMOS transistors Q3, Q4 functions as switches. In the NMOS transistors Q3, Q4 in a differential circuit functioning as the switches, the gate voltages are controlled on the basis of the level (the high potential side output voltage or the low potential side output voltage) of the output of the switching controller 15. If the level of the output of the switching controller 15 is at Hi (the high potential side output voltage), the NMOS transistor Q4 is turned ON, and the NMOS transistor Q3 is turned OFF. Then, a drain current $I_{DAC}$ of the NMOS transistor Q2 flows through the NMOS transistor Q4. Here, the drain current $I_{DAC}$ corresponds to $I_{out}$ of the current mirror circuit 1, and the drain of the NMOS transistor Q2 is operationally connected to the terminal A. On the other hand, if the level of the output of the switching controller 15 is at Lo (the low potential side output voltage), the NMOS transistor Q4 is turned OFF, and the Lo level from the switching controller 15 is inverted by the inverter 16 and it becomes at the Hi level. Thus, the NMOS transistor Q3 is turned ON. So, the drain current $I_{DAC}$ of the NMOS transistor Q2 flows through the NMOS transistor Q3.

The comparator 13 compares the output voltage $V_{out}$ (the voltage between the terminal E and the ground) of the operational amplifier 12 with the reference voltage $V_1$ (the voltage between the terminal F and the ground) resulting from the reference voltage source 21, and then outputs the comparison result signal. Here, the voltage applied to the voltage between the terminal F and the ground may not be limited to the reference voltage $V_1$ resulting from the reference voltage source 21. For example, it may be a predetermined voltage resulting from a voltage source (not shown) that is not connected to the operational amplifier 12. In this case, the predetermined voltage is equal to the reference voltage $V_1$ resulting from the reference voltage source 21. The switching controller 15 controls the switching operation of the NMOS transistors Q3, Q4 based on the comparison result output of the comparator 13. The switching controller 15 latches the output level of the comparator 13 at a rising edge of a sampling clock, and outputs its inversion signal. That is, if the output level of the comparator 13 is at Hi, it outputs the Lo level, and if the output level of the comparator 13 is at Lo, it outputs the Hi level for one period of the clock.

The operational amplifier 12 uses the fact that when the NMOS transistor Q4 is turned ON, it is operated at $V_{DS} \approx 0$ (V) and the DC gain of the operational amplifier 12 is very large and it is virtually grounded, and then carries out the operation so that the drain voltage of the NMOS transistor Q2 is equal to the reference voltage $V_1$ resulting from the reference voltage source 21. That is, the voltage between the terminal A and the ground becomes equal to the voltage between the terminal B and the ground. The operational amplifier 11 uses the fact that the DC gain of the operational amplifier 11 is very large and it is virtually grounded, and then carries out the operation so that the drain voltage of the NMOS transistor Q1 is equal to the reference voltage $V_1$ resulting from the reference voltage source 21. That is, the voltage between the terminal B and the ground becomes equal to the voltage between the terminal C and the ground. As a result, the drain voltage of the NMOS transistor Q2 (the voltage between the terminal A and the ground) is equal to the drain voltage of the NMOS transistor Q1 (the voltage between the terminal C and the ground).

If the NMOS transistors Q1, Q1 are under the same condition, for example, if they have the same size (corresponding to the gate oxide film thickness $C_{OX}$, the channel length L and the channel width W in the equation (1)) and the same carrier mobility (corresponding to the mobility $\mu$ of the carrier in the equation (1)), the drain current $I_{DAC}$ (having the extremely high accuracy without any channel length modulation effect in the equation (1)) equal to the standard current $I_{in}$ flowing through the NMOS transistor Q1 flows through the NMOS transistor Q2. When the NMOS transistor Q4 is turned ON, the drain current $I_{DAC}$ of the NMOS transistor Q2 is supplied to the capacitor C1 as the output current $I_{out}$. Also, when the NMOS transistor Q3 is turned ON, the drain current $I_{DAC}$ of the NMOS transistor Q2 is supplied through the resistor R2 to one of both terminals of the constant current source 30, and then flows through the power supply voltage $V_{DD}$. Here, when the NMOS transistor Q3 is turned ON, a current flows from the power supply voltage $V_{DD}$ into the resistor R2. However, the NMOS transistor Q2 tries to send the standard current $I_{in}$ (=the drain current $I_{DAC}$) to the resistor R2 through the current mirror. Thus, as the value of the resistor R2, it is set to $(V_{DD}-V_1)/I_{in}$. Hence, when the NMOS transistor Q4 is turned ON after the NMOS transistor Q3 is turned ON, as the state of the current mirror circuit is closer to the stable state, its recovery is done earlier, which results in the reduction in an error of ADC.

The counter 14 counts the clock number, when the output from the comparator 13 is at Hi, among a predetermined all clock number N in the sampling clock.

The current value $I_{ADC}$ ($I_{ADC}=V_{in}/R_1$) in which a potential difference $V_{in}$ between the signal voltage (the voltage between the terminal D and the ground) resulting from the signal voltage source (not shown) and the reference voltage $V_1$ (the voltage between the terminal B and the ground) resulting from the reference voltage source 21 is divided by the resistance value $R_1$ of the resistor R1 is charged in the capacitor C1. At this time, if the output voltage $V_{out}$ (the voltage between the terminal E and the ground) of the operational amplifier 12 is dropped. If the output voltage $V_{out}$ (the voltage between the terminal E and the ground) of the operational amplifier 12 becomes lower than the reference voltage $V_1$ (the voltage between the terminal F and the ground) of the reference voltage source 21, the output of the comparator 13 becomes at the Lo level. Then, in synchronization with the rise of a next sampling clock, the output of the switching controller 15 becomes at the Hi level, and the NMOS transistor Q4 is turned ON. Thus, the charges of the capacitor C1 are discharged. At this time, the output voltage $V_{out}$ (the voltage between the terminal E and the ground) of the operational amplifier 12 is increased. If the output voltage $V_{out}$ (the voltage between the terminal E and the ground) of the operational amplifier 12 becomes higher than the reference voltage $V_1$ (the voltage between the terminal F and the ground) resulting from the reference voltage source 21, the output of the comparator 13 becomes at the Hi level. Then, in synchronization with the rise of a next sampling clock, the output of the switching controller 15 becomes at the Lo level, and the NMOS transistor Q4 is turned OFF. Hence, $(V_{in}/R_1-I_{DAC})$ is charged in the capacitor C1.

When N is made larger, the repetition of the above-mentioned operation leads to the following equation:

$$n \times I_{ADC} = (I_{DAC} - I_{ADC}) \times (N-n) \qquad (3)$$

The expansion of the equation (3) leads to the following equation:

$$V_{in} = I_{DAC} \times R_1 \times (N-n)/N \qquad (4)$$

Accordingly, the $V_{in}$ is converted into a digital value.

The necessity of an absolute accuracy needs the absolute accuracies of $R_1$ and $I_{DAC}$. Since N and n are the digital values, the sufficient reservation of digits disables the occurrence of an error. The constant current source 30 has the circuit configuration similar to that of the current mirror circuit 1. Thus, a current value $I_{in}$ of the constant current source 30 is represented by:

$$I_{in} = V_{ref}/R_{30} \qquad (5)$$

If a current mirror ratio is tentatively assumed to be 1 when the NMOS transistors Q1, Q2 are under the same condition, the accuracy of the current mirror can be sufficiently reserved. Thus, $I_{in}$ is given by:

$$I_{in} = I_{DAC} \qquad (6)$$

Accordingly, Vin is given by:

$$V_{in} = V_{ref} \times (R_1/R_{30}) \times (N-n)/N \qquad (7)$$

In the case of the semiconductor integrated circuit, it is easy to reserve the relative accuracy of the resistor. Thus, the error of $(R_1/R_{30})$ can be made sufficiently small. Hence, the accuracy of the current mirror circuit is extremely important. The analog-digital converter 2 can sufficiently reserve those accuracies.

As mentioned above, according to the analog-digital converter 2, the current mirror circuit 1 can be applied to the current switch portions (the NMOS transistors Q3, Q4) in the charge balance method, in addition to the effect of the current mirror circuit 1.

A second example in which the above-mentioned current mirror circuit 1 is applied to the analog-digital converter will be described below with reference to FIG. 4.

Figure 4:
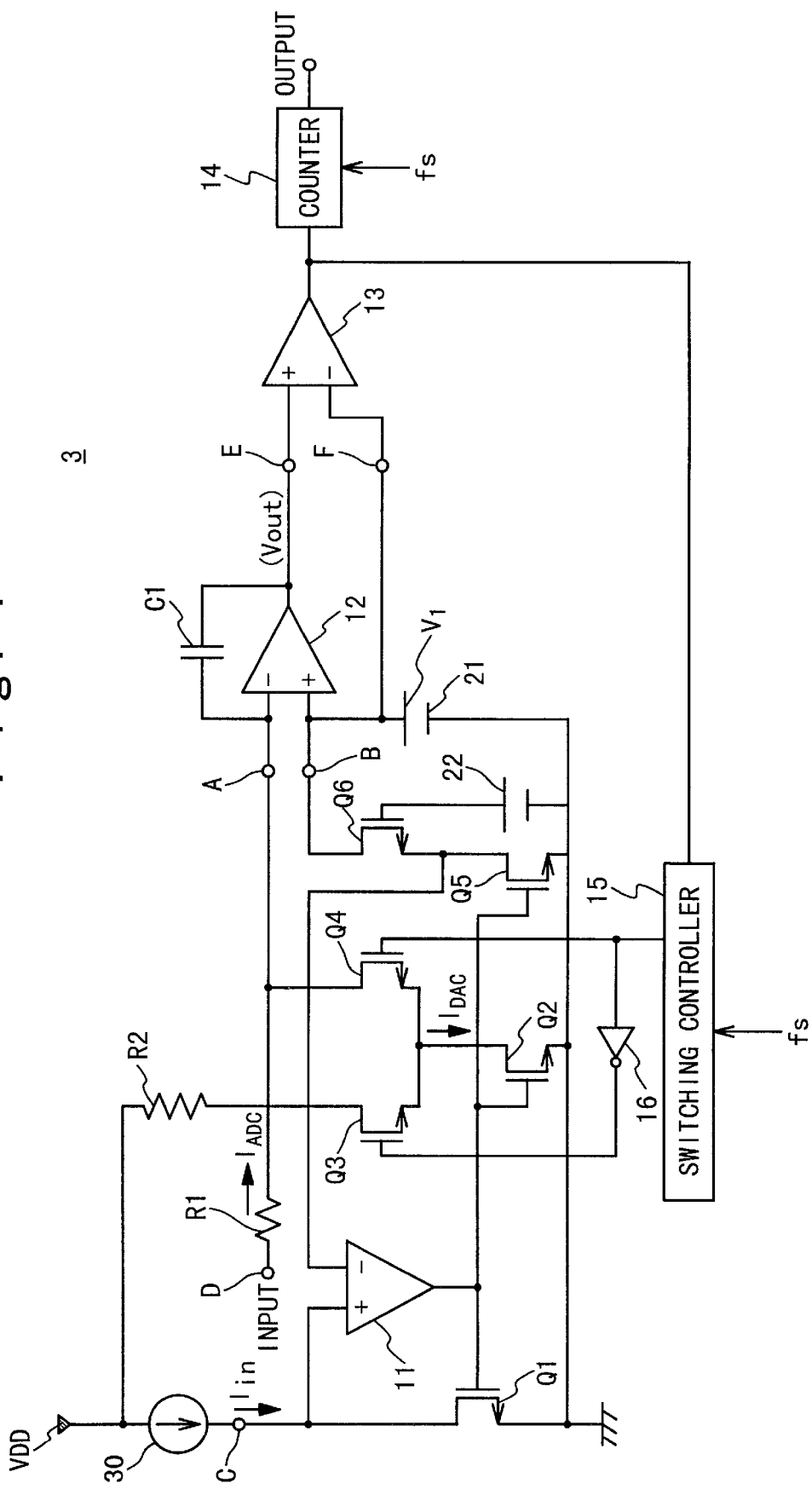
FIG. 4 is a circuit diagram showing a second example in which the current mirror circuit of the present invention is applied to an analog-digital converter.

As shown in FIG. 4, a symbol 3 denotes an analog-digital converter to which the above-mentioned current mirror circuit 1 is applied. The analog-digital converter 3 is provided with the constant current source 30, the operational amplifier 11, the operational amplifier 12, the comparator 13, the counter 14, the switching controller 15, the inverter 16, the reference voltage source 21, a reference voltage source 22, the capacitor C1, the resistors R1, R2 and the N-channel MOS transistors Q1, Q2, Q3, Q4, Q5 and Q6. Hereafter, the N-channel MOS transistor is referred to as the NMOS transistor. Also, in the analog-digital converter 3, the same symbols are given to the members similar to those of the above-mentioned analog-digital converter 2.

The analog-digital converter 2 uses the transistor having the large W/L (the channel width W and the channel length L of the NMOS transistor Q4) as the NMOS transistor Q4, in order to compensate for the drop in the voltage $V_{DS}$ between the drain and the source ($V_{DS} \approx 0$) that is caused by the NMOS transistor Q4. However, the analog-digital converter 3 is the circuit to improve the accuracy by adding a replica circuit composed of the NMOS transistors Q5, Q6 and the reference voltage source 22 to the analog-digital converter 2 and then compensating for the drop in the voltage $V_{DS}$ between the drain and the source that is caused by the NMOS transistor Q4.

In this case, the gate of the NMOS transistor Q6 is connected to a positive terminal of both terminals of the reference voltage source 22. The reference voltage source 22 supplies a reference voltage $V_2$ to the NMOS transistor Q6. A drain of the NMOS transistor Q6 is connected to the terminal B. The inverting input terminal of the operational amplifier 11 is connected to a drain of the NMOS transistor Q5 and a source of the NMOS transistor Q6, instead of the terminal B. A gate of the NMOS transistor Q5 is connected to the gates of the NMOS transistors Q1, Q2. A negative terminal of the reference voltage source 22 and a source of the NMOS transistor Q5 are connected to the low potential side power supply (not shown) and usually grounded.

The operation of the analog-digital converter 3 will be described below with reference to FIG. 4. Here, the operation similar to that of the at analog-digital converter 2 is omitted in the analog-digital converter 3.

The NMOS transistor Q5 generates the current mirror with respect to the NMOS transistor Q1. Here, the NMOS transistor Q5 is formed adjacently to and at the same size as the NMOS transistor Q2. Also, the NMOS transistor Q6 is formed adjacently to and at the same size as the NMOS transistor Q4. The relative accuracy between the NMOS transistors Q2, Q5 and the relative accuracy between the NMOS transistors Q4, Q6 are respectively reserved by using a layout method such as a proximity arrangement and the like. Thus, it is possible to compensate for the drop in the voltage $V_{DS}$ between the drain and the source, which is caused by the NMOS transistor Q4. Also, the reference voltage $V_2$ is supplied from the reference voltage source 22 to the gate of the NMOS transistor Q6. This reference voltage $V_2$ is the voltage equal to the high potential side output voltage of the switching controller 15 for turning ON the NMOS transistor Q4.

When the NMOS transistor Q4 is turned ON, the NMOS transistor Q6 is turned ON by the reference voltage $V_2$ of the reference voltage source 22. So, the operational amplifier 12 compensates the drop in the voltage $V_{DS}$ between the drain and the source that is caused by the NMOS transistor Q4 by the drain voltage of the NMOS transistor Q6. Then, the operational amplifier 12 uses the fact that the DC gain of the operational amplifier 12 is very large and virtually grounded, and then carries out the operation so that the drain voltage of the NMOS transistor Q2 is equal to the reference voltage $V_1$ resulting from the reference voltage source 21. That is, the voltage between the terminal A and the ground is equal to the voltage between the terminal B and the ground. Since the NMOS transistor Q6 is turned ON by the reference voltage $V_2$ of the reference voltage source 22, the operational amplifier 11 compensates for the drop in the voltage $V_{DS}$ between the drain and the source that is caused by the NMOS transistor Q4 by the drain voltage of the NMOS transistor Q5. Then, the fact that the DC gain of the operational amplifier 11 is very large and virtually grounded causes the drain voltage of the NMOS transistor Q2 to become the voltage in which the voltage $V_{DS}$ between the drain and the source of the NMOS transistor Q4 is subtracted from the reference voltage $V_1$, and also causes the drain voltage of the NMOS transistor Q1 to become the voltage in which the voltage $V_{DS}$ between the drain and the source of the NMOS transistor Q6 is subtracted from the reference voltage $V_1$. Since the NMOS transistor Q4 is equal to the NMOS transistor Q6, the drain voltage of the NMOS transistor Q2 (the voltage between the terminal A and the ground) is equal to the drain voltage of the NMOS transistor Q1 (the voltage between the terminal C and the ground).

As mentioned above, according to the analog-digital converter 3, the accuracy is improved by adding the replica circuit composed of the NMOS transistors Q5, Q6 and the reference voltage source 22 and then compensating for the drop in the voltage $V_{DS}$ between the drain and the source, which is caused by the NMOS transistor Q4, without any necessity of the large transistor to the NMOS transistor Q4 in the analog-digital converter 2, in addition to the effect of the analog-digital converter 2.

Moreover, according to the analog-digital converter 3, the relative accuracy between the NMOS transistor Q2 and the NMOS transistor Q5 and the relative accuracy between the NMOS transistor Q4 and the NMOS transistor Q6 are respectively reserved by using the layout method such as the proximity arrangement and the like. Accordingly, it is possible to compensate for the drop in the voltage $V_{DS}$ between the drain and the source, which is caused by the NMOS transistor Q4.

A third example in which the above-mentioned current mirror circuit 1 is applied to the analog-digital converter will be described below with reference to FIG. 5.

Figure 5:
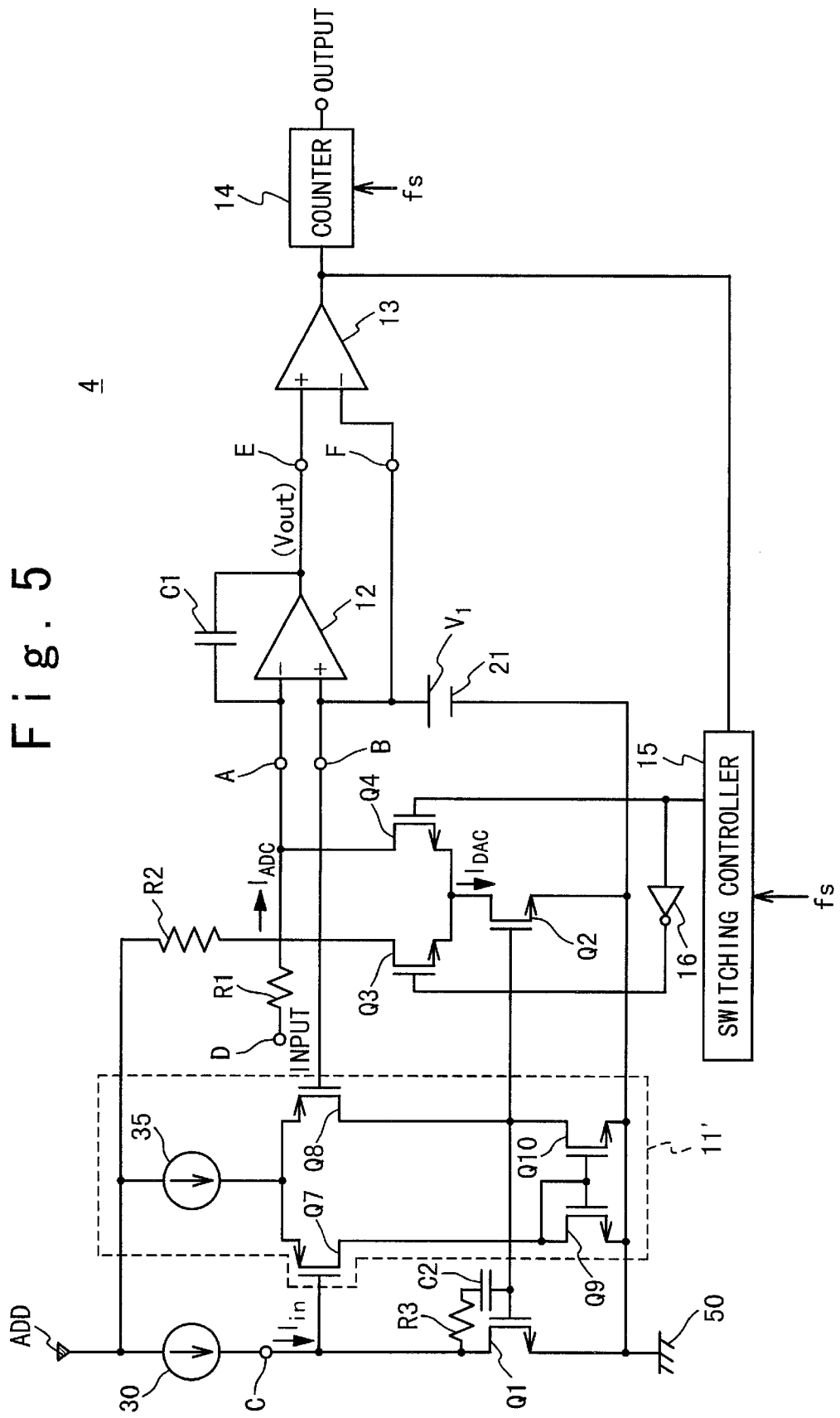
FIG. 5 is a circuit diagram showing a third example in which the current mirror circuit of the present invention is applied to an analog-digital converter.

As shown in FIG. 5, a symbol 4 denotes an analog-digital converter to which the above-mentioned current mirror circuit 1 is applied. The analog-digital converter 4 is provided with the constant current source 30, the operational amplifier 12, the comparator 13, the counter 14, the switching controller 15, the inverter 16, the reference voltage source 21, a constant current source 35, the capacitors C1, C2, the resistors R1, R2 and R3, the N-channel MOS transistors Q1, Q2, Q3, Q4, Q9 and Q10, and P-channel MOS transistors Q7, Q8. Hereafter, the N-channel MOS transistor is referred to as the NMOS transistor, and the P-channel MOS transistor is referred to as the PMOS transistor. Also, in the analog-digital converter 4, the same symbols are given to the members similar to those of the above-mentioned analog-digital converter 2.

The analog-digital converter 4 is the circuit to improve the stability by designing the operational amplifier 11 of the analog-digital converter 2 so that it is composed of the PMOS transistors Q7, Q8, the NMOS transistors Q9, Q10 and the constant current source 35, and a compensation circuit composed of the capacitor C2 and the resistor R3 is added.

In this case, sources of the PMOS transistors Q7, Q8 are connected to each other. The high potential side voltage source (not shown) is connected to one of both terminals of the constant current source 35, and the power supply voltage $V_{DD}$ is inputted/supplied. The sources of the PMOS transistors Q7, Q8 are connected to the other terminal of the constant current source 35. The constant current source 35 supplies a standard current $I_{35}$. In the NMOS transistors Q9, Q10, their gates are connected to each other and usually grounded. A drain of the NMOS transistor Q9 is connected to a drain of the PMOS transistor Q7 and the gate of the NMOS transistor Q9. A drain of the NMOS transistor Q10 is connected to the gates of the NMOS transistors Q1, Q2 and the drain of the NMOS transistor Q8.

Here, the PMOS transistors Q7, Q8, the NMOS transistors Q9, Q10 and the constant current source 35 constitute a differential amplifier 11' with the NMOS transistor Q10 as an output. This differential amplifier 11' corresponds to the operational amplifier 11. The drain of the NMOS transistor Q10 corresponds to an output terminal of the differential amplifier 11'. The gate of the PMOS transistor Q7 corresponds to a non-inverting input terminal of the differential amplifier 11', and it is connected to the terminal C. The gate of the PMOS transistor Q8 corresponds to an inverting input terminal of the differential amplifier 11', and it is connected to the terminal B.

Also, the compensation circuit composed of the capacitor C2 and the resistor R3 are connected between the drain and the gate of the NMOS transistor Q1. One of both terminals of the resistor R3 is connected to the drain of the NMOS transistor Q1. The other terminal of the resistor R3 is connected to one of both terminals of the capacitor C2. The other terminal of the capacitor C2 is connected to the gate of the NMOS transistor Q1.

The operation of the analog-digital converter 4 will be described below with reference to FIG. 5. Here, the operation similar to that of the analog-digital converter 2 is omitted in the analog-digital converter 4.

This is the source ground amplifier when the drain of the NMOS transistor Q1 is viewed from the gate of the NMOS transistor Q1. The analog-digital converter 4 is the two-stage amplifier composed of the source ground amplifier of the NMOS transistor Q1 and the differential amplifier 11'. A negative phase signal is fed back to the gate of the PMOS transistor Q7 (the non-inverting input terminal of the differential amplifier 11'). For this reason, the compensation circuit is required for the stable operation. The phase compensation is carried out by the resistor R3 and the capacitor C3.

The current equal to half the standard current $I_{35}$ resulting from the constant current source 35 flows through the NMOS transistor Q10 since the PMOS transistor Q8 is turned ON by the reference voltage $V_1$ of the reference voltage source 21. Also, the current equal to half the standard current $I_{35}$ resulting from the constant current source 35 flows through the NMOS transistor Q9 since the PMOS transistor Q7 is turned ON by the drain voltage of the NMOS transistor Q9. The initial values of the gate voltages of the NMOS transistors Q1, Q2 are equal to the drain voltage of the NMOS transistor Q10. However, the drain voltages of the NMOS transistors Q9, Q10 which are connected as the current mirror are substantially equal to each other by the gain of the differential amplifier. Thus, the initial values of the gate voltages of the NMOS transistors Q1, Q2 becomes equal to the drain voltage of the NMOS transistor Q9. Here, let us suppose that the channel length of the NMOS transistor Q1 is $L_{Q1}$, the channel width thereof is $W_{Q1}$, the channel length of the NMOS transistor Q9 is $L_{Q9}$, the channel width thereof is $W_{Q9}$, the channel length of the NMOS transistor Q10 is $L_{Q10}$ and the channel width thereof is $W_{Q10}$. Then, if $L_{Q1}=L_{Q9}=L_{Q10}$ and the standard current $I_{in}$ of the constant current source 30 and the standard current $I_{35}$ of the constant current source 35 are used to design so as to establish $I_{in}/W_{Q1}=(I_{35}/2)/W_{Q9}=(I_{35}/2)/W_{Q10}$, the NMOS transistor Q9 and the NMOS transistor Q1 are operated at the substantially same bias. For this reason, the initial values of the gate voltages of the NMOS transistors Q1, Q2 are equal to the voltage when the NMOS transistor Q1 is connected as the usual current mirror (the analog-digital converter 2). Thus, it is easy to attain the expected stable operation.

Accordingly, the differential amplifier 11' carries out the operation so that the drain voltage of the NMOS transistor Q1 is equal to the reference voltage $V_1$ resulting from the reference voltage source 21. That is, the voltage between the terminal B and the ground becomes equal to the voltage between the terminal C and the ground. As a result, the drain voltage of the NMOS transistor Q2 (the voltage between the terminal A and the ground) becomes equal to the drain voltage of the NMOS transistor Q1 (the voltage between the terminal C and the ground).

As mentioned above, according to the analog-digital converter 4, the stableness is improved by designing the operational amplifier 11 of the analog-digital converter 2 so that it is composed of the PMOS transistors Q7, Q8 and the NMOS transistors Q9, Q10, and then adding the compensation circuit composed of the capacitor C2 and the resistor R3, in addition to the effect of the analog-digital converter 2.

Figure 6:
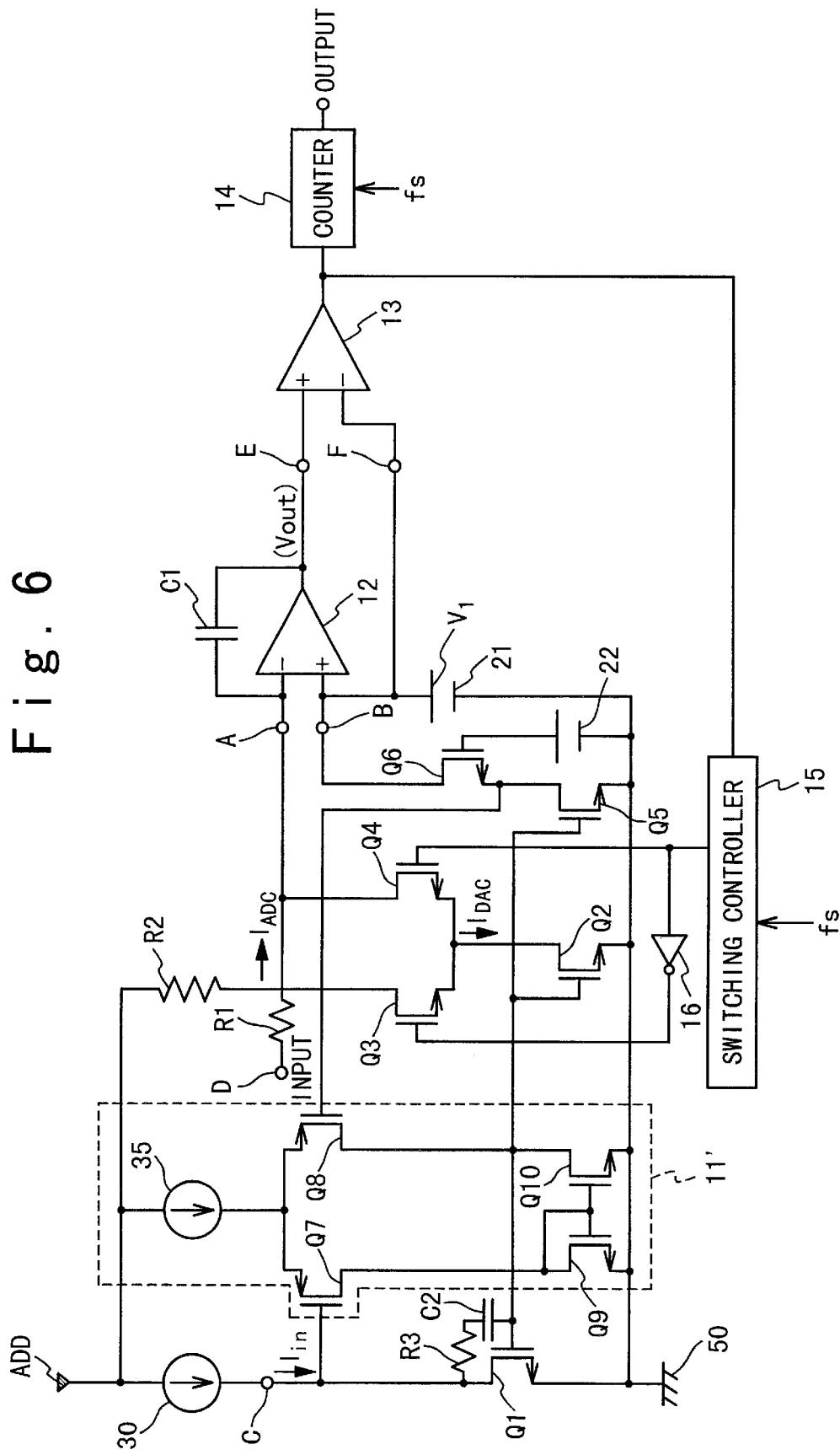
FIG. 6 is a circuit diagram showing a fourth example in which the current mirror circuit of the present invention is applied to an analog-digital converter.

Also, the analog-digital converter 4 is not limited to the above-mentioned examples. As an analog-digital converter 5 shown in FIG. 6, it is desirable to compensate for the drop in the voltage $V_{DS}$ between the drain and the source that is caused by the NMOS transistor Q4, by adding the replica circuit composed of the NMOS transistors Q5, Q6 and the reference voltage source 22 to the analog-digital converter 4.

In this case, the gate of the NMOS transistor Q6 is connected to the positive terminal of both terminals of the reference voltage source 22, and the reference voltage source 22 supplies the reference voltage $V_2$. The drain of the NMOS transistor Q6 is connected to the terminal B. The gate of the NMOS transistor Q8 is connected to the drain of the NMOS transistor Q5 and the source of the NMOS transistor Q6, instead of the terminal B. The gate of the NMOS transistor Q5 is connected to the gates of the NMOS transistors Q1, Q2. A negative terminal of the reference voltage source 22 and the source of the NMOS transistor Q5 are connected to the low potential side voltage source (not shown), and usually grounded.

Accordingly, the analog-digital converter 5 has the effects of the analog-digital converter 3 and the analog-digital converter 4.

The current mirror circuit and the analog-digital converter, according to the present invention, can obtain the current mirror at the high accuracy even at the low power supply voltage.

What is claimed is:

1. A current mirror circuit comprising:
   a first constant current source which outputs a constant current to a first node based on a first reference voltage;
   a first MOS transistor which has a source grounded, a gate connected to a second MOS transistor and a drain connected to said first node;
   said second MOS transistor which has a source grounded, a gate connected to said first MOS transistor and a drain connected to a second node;
   a first operational amplifier which has a first input terminal connected to said first node, a second input terminal connected to a third node which is connected to a second reference voltage and an output terminal connected to said gates of said first and second MOS transistors; and
   a second operational amplifier which has a first input terminal connected to said third node, a second input terminal connected to said second node and an output terminal connected through a feedback circuit to said second node.

2. The current mirror circuit according to claim 1, wherein said first constant current source comprises:
   said first reference voltage;
   a third MOS transistor which has a source grounded, a gate connected to an output terminal of a third operational amplifier and a drain connected to a current mirror circuit with cascode connection;
   said third operational amplifier which has a first input terminal connected to said first reference voltage, a second input terminal connected to said source of said third MOS transistor and an output terminal connected to said gate of said third MOS transistor; and said current mirror circuit with cascode connection which is connected to said drain of said third MOS transistor, a power supply voltage and said first node.

3. The current mirror circuit according to claim 1, further comprising:

a second resistor and a fourth MOS transistor which are connected in series between a power supply voltage and said drain of said second MOS transistor; and a fifth MOS transistor which is connected in series between said second node and said drain of said second MOS transistor, wherein said second node is connected to a signal voltage through a first resistor.

4. An analog-digital converter comprising:

a first constant current source which outputs a constant current to a first node based on a first reference voltage;

a first MOS transistor which has a source grounded, a gate connected to a second MOS transistor and a drain connected to said first node;

said second MOS transistor which has a source grounded, a gate connected to said first MOS transistor and a drain connected to a second node;

a second resistor and a fourth MOS transistor which are connected in series between a power supply voltage and said drain of said second MOS transistor;

a fifth MOS transistor which is connected in series between said second node and said drain of said second MOS transistor, wherein said second node is connected to a signal voltage through a first resistor;

a first operational amplifier which has a first input terminal connected to said first node, a second input terminal connected to a third node which is connected to a second reference voltage and an output terminal connected to said gates of said first and second MOS transistors;

a second operational amplifier which has a first input terminal connected to said third node, a second input terminal connected to said second node and an output terminal connected through a first capacitance to said second node, functioning as an integrator; and a comparator comparing said output of said second operational amplifier with a predetermined voltage, and outputting said comparison result output.

5. The analog-digital converter according to claim 4, wherein said first constant current source comprises:

said first reference voltage, a third MOS transistor which has a source grounded, a gate connected to an output terminal of a third operational amplifier and a drain connected to a current mirror circuit with cascode connection;

said third operational amplifier which has a first input terminal connected to said first reference voltage, a second input terminal connected to said source of said third MOS transistor and an output terminal connected to said gate of said third MOS transistor; and said current mirror circuit with cascode connection which is connected to said drain of said third MOS transistor, a power supply voltage and said first node.

6. The analog-digital converter according to claim 4, further comprising:

a switching controller controlling a switching operations of said fourth and fifth MOS transistors based on said comparison result output.

7. The analog-digital converter according to claim 4, further comprising:

a sixth and a seventh MOS transistors which are connected in series; and a third reference voltage which is connected to a gate of said sixth MOS transistor, wherein a drain of said sixth MOS transistor is connected to said third node, said second input terminal of said first operational amplifier is connected to a node between said sixth and said seventh MOS transistors, and a gate of said seventh MOS transistor is connected to said gates of said first and said second MOS transistors.

8. The analog-digital converter according to claim 4, wherein said first operational amplifier comprises:

an eighth and a ninth MOS transistors whose sources are connected to each other;

a second constant current source which is connected to said sources of said eighth and ninth MOS transistors; and a tenth and an eleventh MOS transistors whose sources are grounded and their gates are connected to each other, wherein a drain of said tenth MOS transistor is connected to a drain of the eighth MOS transistor and said gate of said tenth MOS transistor, a drain of said eleventh MOS transistor is connected to said gates of said first and said second MOS transistors and said drain of said ninth MOS transistor, said gates of said eighth and said ninth MOS transistors correspond to said first and said second input terminals of said first operational amplifier, said gate of said eighth MOS transistor is connected to said first node, said gate of said ninth MOS transistor is connected to said third node, and said drain of said eleventh MOS transistor corresponds to said output terminal of said first operational amplifier.

9. The analog-digital converter according to claim 8, further comprising:

a compensation circuit which is connected between said gate and said drain of said first MOS transistor.

10. The analog-digital converter according to claim 9, wherein said compensation circuit comprises:

a second capacitor and a third resistor which are connected in series, wherein said third resistor is connected to said drain of said first MOS transistor, and said second capacitor is connected to said gate of said first MOS transistor.

11. The analog-digital converter according to claim 4, wherein said predetermined voltage is equal to said second reference voltage.

* * * * *